(12) United States Patent
Bhavnagarwala et al.

(10) Patent No.: US 9,792,984 B1
(45) Date of Patent: Oct. 17, 2017

(54) METHOD, SYSTEM AND DEVICE FOR NON-VOLATILE MEMORY DEVICE OPERATION

(71) Applicant: ARM Ltd., Cambridge (GB)

(72) Inventors: Azeez Jennudin Bhavnagarwala, Newtown, CT (US); Piyush Agarwal, Noida (IN); Akshay Kumar, New Delhi (IN)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/335,998

(22) Filed: Oct. 27, 2016

(51) Int. Cl.
*G11C 11/16* (2006.01)
*G11C 13/00* (2006.01)

(52) U.S. Cl.
CPC ............ *G11C 13/004* (2013.01); *G11C 11/16* (2013.01); *G11C 13/0007* (2013.01); *G11C 13/0026* (2013.01); *G11C 13/0028* (2013.01); *G11C 13/0069* (2013.01); *G11C 13/0097* (2013.01)

(58) Field of Classification Search
CPC ............................ G11C 13/0069; G11C 11/16
USPC .................................................. 365/148, 158
See application file for complete search history.

(56) References Cited

U.S. PATENT DOCUMENTS

| | | | |
|---|---|---|---|
| 5,627,779 A * | 5/1997 | Odake ................ | G11C 16/0416 257/316 |
| 6,999,345 B1 * | 2/2006 | Park ................... | G11C 16/3459 365/185.18 |
| 7,298,640 B2 | 11/2007 | Chen et al. | |
| 7,639,523 B2 | 12/2009 | Celinska et al. | |
| 7,778,063 B2 * | 8/2010 | Brubaker ............ | H01L 27/2409 365/148 |
| 7,872,900 B2 * | 1/2011 | Paz de Araujo ........ | H01L 45/04 365/148 |
| 9,514,814 B1 | 12/2016 | Sandhu et al. | |
| 9,558,819 B1 * | 1/2017 | Aitken ............... | G11C 13/0007 |
| 9,584,118 B1 | 2/2017 | Dao et al. | |
| 9,589,636 B1 | 3/2017 | Bhavnagarwala et al. | |
| 2006/0034142 A1 * | 2/2006 | Ooishi ..................... | G11C 8/10 365/230.06 |
| 2006/0126374 A1 * | 6/2006 | Waller ................... | G11C 7/065 365/149 |
| 2006/0133183 A1 * | 6/2006 | Hsu ......................... | G11C 7/12 365/230.05 |
| 2007/0153604 A1 * | 7/2007 | Tsao ........................ | G11C 7/08 365/220 |
| 2008/0106925 A1 * | 5/2008 | Paz de Araujo ........ | H01L 45/04 365/148 |
| 2008/0106926 A1 * | 5/2008 | Brubaker ............ | H01L 27/2409 365/148 |
| 2008/0107801 A1 | 5/2008 | Celinska et al. | |
| 2009/0168542 A1 * | 7/2009 | Hamada ................. | G11C 16/34 365/185.25 |
| 2009/0296451 A1 * | 12/2009 | Asao .................. | G11C 13/0002 365/148 |

(Continued)

*Primary Examiner* — Michael Tran
(74) *Attorney, Agent, or Firm* — Berkeley Law & Technology Group, LLP (57) ABSTRACT

Disclosed are methods, systems and devices for operation of non-volatile memory devices. In one aspect, a correlated electron switch (CES) device may be placed in any one of multiple memory states in a write operation. Limiting current between terminals of the non-volatile memory device during read operations may enable use of higher voltages for higher realized gain.

19 Claims, 7 Drawing Sheets

(56) References Cited

U.S. PATENT DOCUMENTS

| | | | |
|---|---|---|---|
| 2011/0019487 A1* | 1/2011 | Chen | G11C 8/08 365/189.07 |
| 2011/0305081 A1* | 12/2011 | Lee | G11C 11/5628 365/185.03 |
| 2013/0064009 A1* | 3/2013 | Kitano | G11C 19/0808 365/158 |
| 2013/0200323 A1 | 8/2013 | Pham et al. | |
| 2013/0214232 A1 | 8/2013 | Tendulkar et al. | |
| 2013/0285699 A1 | 10/2013 | McWilliams et al. | |
| 2013/0326317 A1* | 12/2013 | Adler | G06F 11/108 714/800 |
| 2014/0133230 A1* | 5/2014 | Kamei | G11C 16/28 365/185.11 |
| 2015/0194192 A1* | 7/2015 | Kern | G11C 7/062 365/189.06 |
| 2016/0099070 A1* | 4/2016 | Jiang | G11C 16/28 365/185.21 |
| 2017/0033782 A1 | 2/2017 | Shifren et al. | |
| 2017/0045905 A1 | 2/2017 | Sandhu et al. | |
| 2017/0047919 A1* | 2/2017 | Sandhu | H03K 17/14 |
| 2017/0069378 A1 | 3/2017 | Shifren et al. | |

\* cited by examiner

METHOD, SYSTEM AND DEVICE FOR NON-VOLATILE MEMORY DEVICE OPERATION

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and $\epsilon$ of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments are still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need in the art for a non-volatile memory that is deterministic has low power, high speed, high density and stability, and in particular, such a memory that is scalable to feature sizes well below 65 nanometers (nm).

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may be best understood by reference to the following detailed description if read with the accompanying drawings in which:

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Particular aspects of the present disclosure incorporate a Correlated Electron Material (CEM) to form a correlated electron switch (CES). In this context, a CES may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES between an insulative state and a conductive state may be understood in terms of a Mott transition. In a Mott transition, a material may switch from an insulative state to conductive state if a Mott transition condition occurs. The criteria may be defined by the condition $(n_C)^{1/3} a=0.26$, where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES device; a write circuit for placing the resistive switching memory cell in a first resistive state or a second resistive state depending on signals provided to the memory cell, wherein a resistance of the CES is higher in the second resistance state than in the first resistance state; and a read circuit for sensing the state of the memory cell and providing an electrical signal corresponding to the sensed state of the memory cell. In one aspect, a resistance of a CES in the second memory cell state may be more than 100 times the resistance in the second memory cell state. In a particular implementation, a CES device may switch resistive states responsive to a Mott-transition in the majority of the volume of the CES device. In one aspect, a CES device may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first impedance memory state referred to as an insulative or high impedance memory state the memory device in one aspect is less conductive (or more insulative) than while the memory device in a second memory state referred to as a conductive or low impedance memory state.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

Figure 1A:
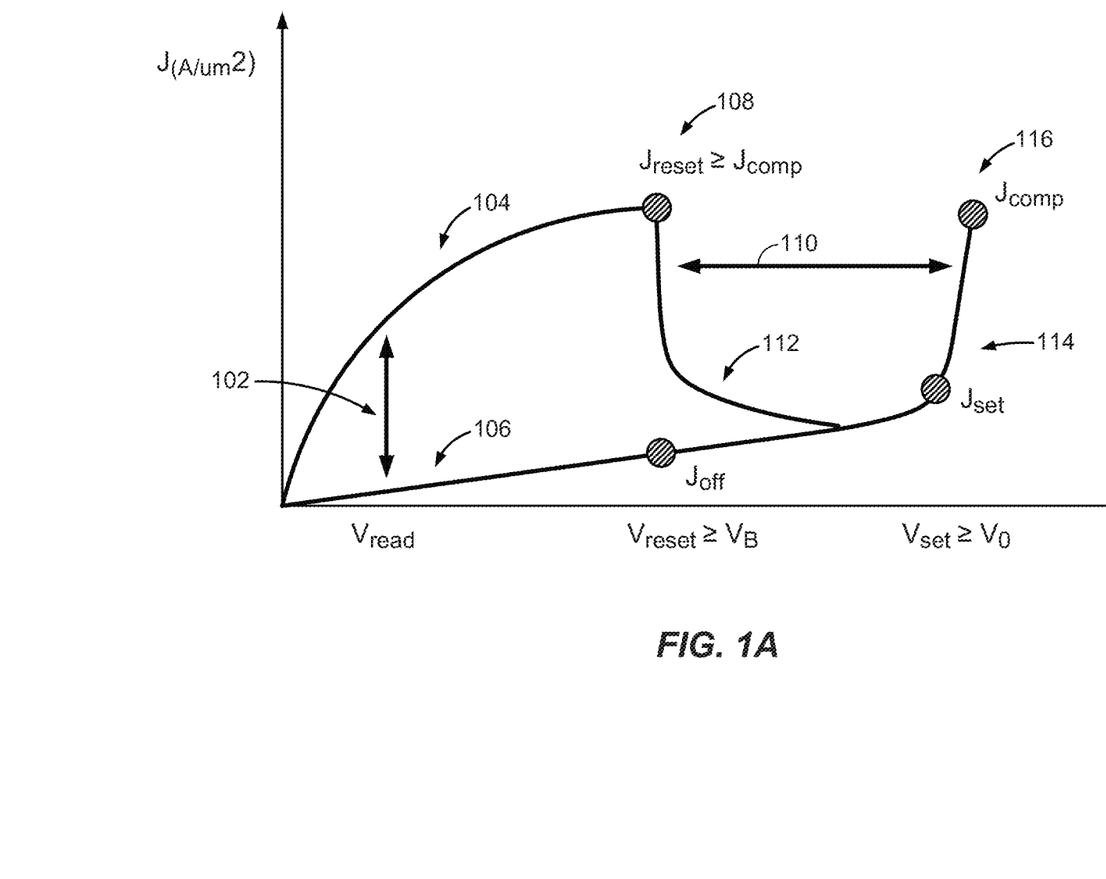
FIG. 1A shows a plot of current density versus voltage for a CES device according to an embodiment.

FIG. 1A shows a plot of current density versus voltage across terminals (not shown) for a CES device according to an embodiment. Based, at least in part, on a voltage applied to terminals of the CES device (e.g., in a write operation), the CES may be placed in a conductive state or an insulative state. For example application of a voltage $V_{set}$ and current density $J_{set}$ may place the CES device in a conductive memory state and application of a voltage $V_{reset}$ and a current density $J_{reset}$ may place the CES device in an insulative memory state. Following placement of the CES in an insulative state or conductive memory state, the particular state of the CES device may be detected by application of a voltage $V_{read}$ (e.g., in a read operation) and detection of a current or current density at terminals of the CES device.

According to an embodiment, the CES device of FIG. 1A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO($C_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO($L_x$), where $L_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES device may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES device is still in the insulative state, current may generated by transportation of electron holes. If enough bias is applied across terminals of the CES, electrons may be injected into a metal-insulator-metal (MIM) diode over the potential barrier of the MIM device. If enough electrons have been injected and enough potential is applied across terminals to place the CES device in a set state, an increase in electrons may screen electrons and remove a localization of electrons, which may collapse the band-splitting potential forming a metal.

According to an embodiment, current in a CES device may be controlled by an externally applied "compliance" condition determined based, at least in part, on the external current limited during a write operation a write operation to place the CES device in a conductive state. This externally applied compliance current may also set a condition of a current density for a subsequent reset operation to place the CES in an insulative state. As shown in the particular implementation of FIG. 1A, a current density $J_{comp}$ applied during a write operation at point 116 to place the CES device in a conductive state may determine a compliance condition for placing the CES device in insulative state in a subsequent write operation. As shown, the CES device may be subsequently placed in an insulative state by application of a current density $J_{reset} \geq J_{comp}$ at a voltage $V_{reset}$ at point 108, where $J_{comp}$ is externally applied.

The compliance condition therefore may determine a number of electrons in a CES device which are to be "captured" by holes for the Mott transition. In other words, a current applied in a write operation to place a CES device in a conductive memory state may determine a number of holes to be injected to the CES device for subsequently transitioning the CES device to an insulative memory state.

As pointed out above, a reset condition may occur in response to a Mott transition at point 108. As pointed out above, such a Mott transition may occur at condition in a CES device in which a concentration of electrons n equals a concentration of electron holes p. This condition may be modeled according to expression (1) as follows:

$$\lambda_{TF} n^{\frac{1}{3}} = C \sim 0.26 \tag{1}$$

$$n = \left(\frac{C}{\lambda_{TF}}\right)^3$$

where:

$\lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES device. Here, injection of holes may meet a Mott transition criterion for the conductive state to insulative state transition at current $I_{MI}$ as a critical voltage $V_{MI}$ is applied across terminals of CES device. This may be modeled according to expression (3) as follows:

$$I_{MI}(V_{MI}) = \frac{dQ(V_{MI})}{dt} \approx \frac{Q(V_{MI})}{t} \quad (3)$$

$$Q(V_{MI}) = qn(V_{MI})$$

Where $Q(V_{MI})$ is the charged injected (hole or electron) and is a function of an applied voltage.

Injection of electron holes to enable a Mott transition may occur between bands and in response to critical voltage $V_{MI}$ and critical current $I_{MI}$. By equating electron concentration n with a charge concentration to bring about a Mott transition by holes injected by $I_{MI}$ in expression (3) according to expression (1), a dependency of such a critical voltage $V_{MI}$ on Thomas Fermi screening length $\lambda_{TF}$ may be modeled according to expression (4) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (4)$$

$$J_{reset}(V_{MI}) = J_{MI}(V_{MI}) = \frac{I_{MI}(V_{MI})}{A_{CeRam}} = \frac{q}{A_{CeRam}t}\left(\frac{C}{\lambda_{TF}(V_{MI})}\right)^3$$

Where:
$A_{CeRam}$ is a cross-sectional area of a CES element; and
$J_{reset}(V_{M1})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES to the conductive memory state at a critical voltage $V_{MI}$ enabling transition to the conductive memory state may be expressed according to expression (6) as follows:

$$I_{MI}(V_{MI}) = \frac{dQ(V_{MI})}{dt} \approx \frac{Q(V_{MI})}{t} \quad (6)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{MI}) = J_{injection}(V_{MI}) = J_{MI}(V_{MI}) = \frac{I_{MI}(V_{MI})}{A_{CeRam}} = \frac{q}{A_{CeRam}t}\left(\frac{C}{a_B}\right)^3$$

where:
AB is a Bohr radius.

According to an embodiment, a "read window" 102 for detecting a memory state of a CES device in a read operation may be set out as a difference between a portion 106 the plot of FIG. 1A while the CES device is in an insulative state and a portion 104 of the plot FIG. 1A while the CES device is in a conductive state at a read voltage $V_{read}$. In a particular implementation, read window 102 may be used to determine a Thomas Fermi screening length $\lambda_{TF}$ of material making up the CES device. For example, at a voltage $V_{reset}$, current densities $J_{reset}$ and $J_{set}$ may be related to according to expression (7) as follows:

$$\lambda_{TF}(@V_{reset}) = a_B\left(\frac{J_{reset}}{J_{off}}\right)^{\frac{1}{3}} \quad (7)$$

In another embodiment, a "write window" 110 for placing a CES device in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined, at least in part, by materials and doping of the CES device.

Figure 1B:
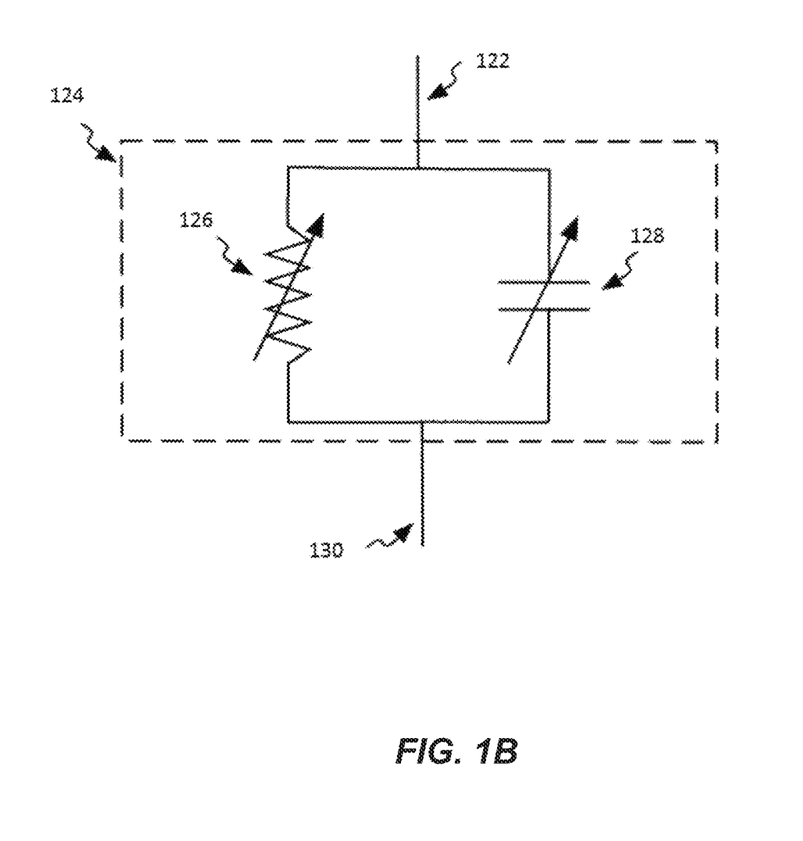
FIG. 1B is a schematic diagram of an equivalent circuit to a CES device according to an embodiment.

The transition from high resistance/capacitance to low resistance/capacitance in a CES device may be represented by a singular impedance of the CES device. FIG. 1B depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM comprises characteristics of variable capacitance and variable resistance. Table 1 below depicts an example truth table for an example variable impeder device, such as variable impeder device 100.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

Figure 2A:
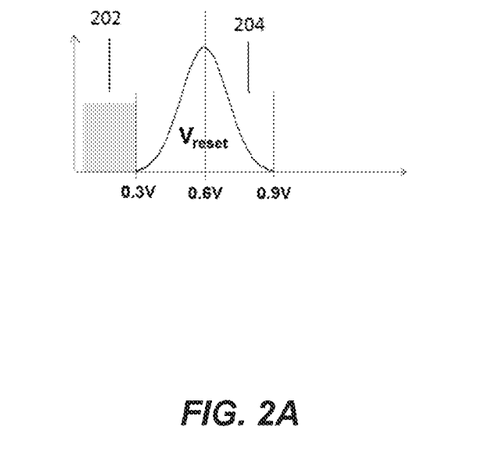
FIG. 2A is a plot illustrating a possible voltages applied to terminals of a CES device in a read operation according to an embodiment.

FIG. 2A is a plot of a possible voltage that may be applied across terminals of a CES device in a read operation according to an embodiment. As shown, a reset voltage $V_{reset}$ may be at about 0.6V. If a read voltage $V_{read}$ is at or below 0.3V, a sense amplifier may not receive sufficient current in a read operation to detect an impedance state of the CES device. On the other hand, increasing a read voltage $V_{read}$ in read operation to a value above $V_{reset}$ may initiate an unintended change of an impedance state to a high impedance or insulative state.

Figure 2B:
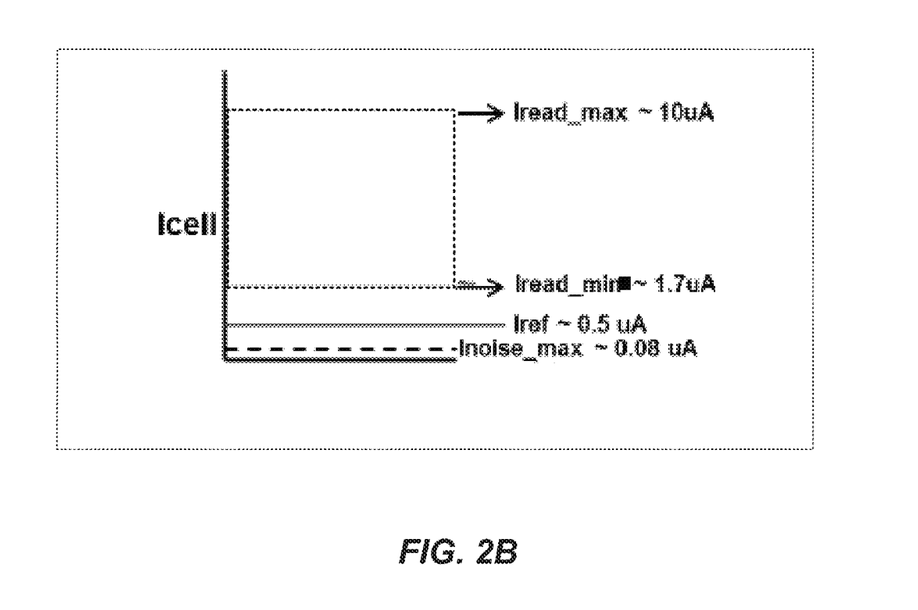
FIG. 2B is a plot showing current in a CES device during a read operation according to an embodiment.

FIG. 2B is a plot of current in a CES device during a read operation according to an embodiment. A level of noise component in current $I_{noise\_max}$ may depend on metal oxide semiconductor (MOS) process variability. A read current in a range between $I_{read\_min}$ and $I_{read\_max}$ may be depend on variability in processes to form a CES from correlated electron material. In a particular implementation discussed below, a sense amplifier may detect an impedance of the CES device based on whether a current in the CES device is above or below a reference current $I_{ref}$. A portion of current in the CES device in a read operation may be attributable to noise. As such, reference current $I_{ref}$ should be sufficiently high to enable accurate detection of a state of the CES device in the presence of noise.

Figure 3:
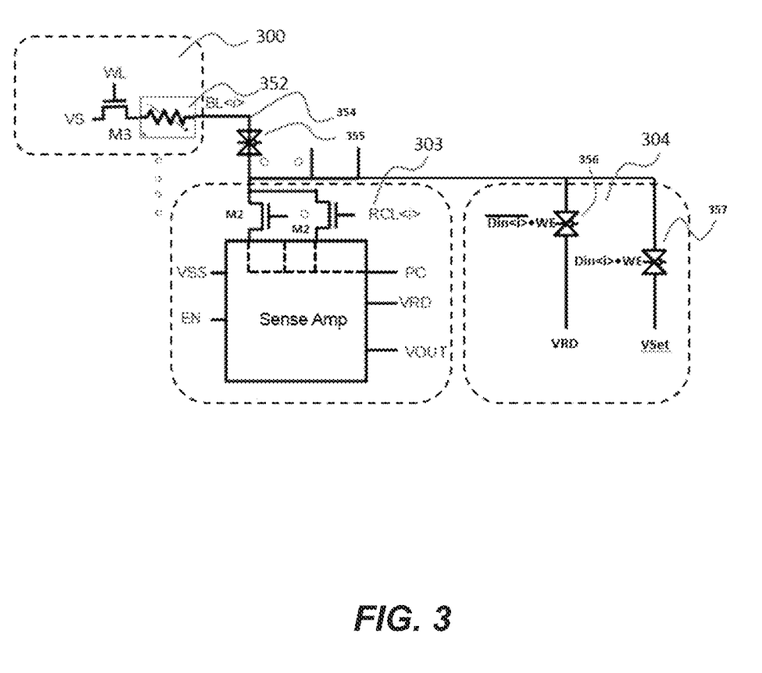
FIG. 3 is a schematic diagram of a circuit comprising a sense amplifier according to an embodiment.

FIG. 3 is a schematic diagram of a memory circuit according to an embodiment. A bitcell circuit 300 may comprise one or more memory elements (e.g., non-volatile memory elements) comprising a CES device. In this context, a "bitcell" or "bitcell circuit" as referred to herein comprises a circuit or portion of a circuit capable of representing a value, symbol or parameter as a state. For example, a bitcell may comprise one or more memory devices that are capable of representing a value, symbol or parameter as a memory state of the memory device. In particular implementations, a bitcell may represent a value, symbol or parameter as a single bit or multiple bits.

According to an embodiment, bitcell circuit 300 in FIG. 3 may comprise memory elements having a behavior similar to that of the CES device discussed above in connection with FIGS. 1A and 2. In this context, a "bitline" comprises a conductor that is connectable to at least one terminal of a memory element during a write operation to transmit a programming signal altering a memory state of the memory element, or during a read operation to transmit a signal indicative of a current memory state of the memory element. Such a bitline 354 coupled to a first terminal of CES element 352 is shown in FIG. 3 as a non-limiting example. A second terminal of CES element 352 may be coupled to a source voltage VS through an FET M3 responsive to a wordline voltage on a gate of FET M3. Sense amplifier 303 may provide a peripheral read circuit to detect a memory state of CES element 352 in bitcell 300 based on a magnitude of current or voltage from bitline BL through transistor M2 in a read operation. A write driver circuit 304 may comprise CMOS transmission gates 356 and 357 that may be selected in a write operation according to whether the particular write operation a reset operation (e.g., to place CES element 352 in an insulative or high impedance state) or a set operation (e.g., to place CES element 352 in a conductive or low impedance state). For example, transmission gate 356 may connect a voltage supply signal VRD to bitline 354 (while transmission gate is open) in a reset operation and transmission gate 357 may connect a voltage Vset to bitline 354 (while transmission gate 356 is open) in a set operation. In this embodiment, the voltage signal VRD driving the reset operation may also be applied to sense amplifier 303 as a peripheral circuit supply voltage.

In this context, a "voltage supply" means a circuit element that generates a voltage supply signal at voltage level at one or more nodes relative to one or more reference nodes. In one implementation, a voltage supply may comprise a circuit to generate a predetermined voltage level. It should be understood, however, that this is merely an example of a voltage supply, and claimed subject matter is not limited in this respect. In this context, a "source voltage" means one or more nodes maintained at a particular voltage level. In one particular implementation, a source voltage may comprise a voltage maintained at one or more reference nodes such as a ground node or a node at 0.0V relative to a voltage of a voltage supply signal maintained by a voltage supply. It should be understood, however, that this is merely an example of a source voltage, and claimed subject matter is not limited in this respect.

FIG. 3 is a schematic diagram of a sense amplifier 303 according to an embodiment for use in detecting an impedance state of CES 352 in a read operation. In a particular implementation, and as discussed above, sense amplifier 303 may limit a current density in a CES during a read operation to enable application of a read voltage (e.g., $V_{read}$) from a voltage source signal VRD generated from a voltage source (not shown) where VRD may have a magnitude that is equal to or greater than a magnitude of a voltage (e.g., $V_{reset}$) applied in a write operation to place CES 352 in a high impedance or insulative state. FIG. 3 shows FET M2 connecting selected bit column 354 to sense amplifier 303 in a read operation. It should be understood, however that these are merely examples of how a CES device may be connected to a sense circuit in a read operation and claimed subject matter is not limited in this respect.

According to an embodiment, FET M2 and transmission gate are example structures that may provide conductive elements. In this context, a "conductive element" or "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as, a bipolar transistor, diode, transmission gate, inverter, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

According to an embodiment, in a read operation switch FETs M2 may be closed to pre-charge bitline BL by coupling a pre-charge voltage signal PC to transmission gate 355 while limiting the current to less than the maximum permitted to inhibit an unintended reset operation. Sense amplifier 303 may detect a memory state of the memory element in bitcell 300 based on a magnitude of current or voltage from bitline BL in a read operation. FETs M2 in tandem with devices in transmission gate 355 may limit a current density in CES device 352 during a read operation as discussed above.

According to an embodiment, sense amplifier 303 may receive a supply voltage at voltage supply signal VRD to generate a read signal having a current through FETs M2. It should be apparent that a read signal from a pre-charged bitline having a voltage of voltage supply signal VRD may apply a voltage across CES device in a read operation as $V_{read}=VRD-V_{drop}-VS$, where $V_{drop}$ is a voltage drop across transmission gate 355 and parallel coupled FETs M2 and VS=0.0V, VRD=0.6V and $V_{drop}$=0.4 V, for example, $V_{read}$=0.2 V. It should be understood that these are merely example operating voltages provided for the purpose of illustrating particular aspects of claimed subject matter, and that claimed subject matter is not limited in this respect.

Figure 4:
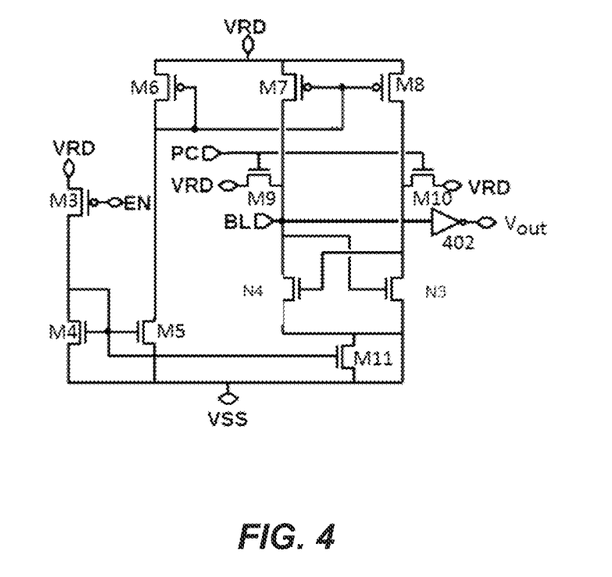
FIGS. 4 through 7 are schematic diagrams of circuits that may be implemented in a sense amplifier according to an embodiment.

FIGS. 4 through 7 are schematic diagrams of circuits that may be implemented in a sense amplifier for detecting an impedance state of a memory element (e.g., a CES device, CeRAM device or other non-volatile memory device) in a read operation according to an embodiment. In FIG. 4, for example, a reference current may be generated through FETs M3 and M4 in response to a drop in voltage of signal EN applied to a gate of FET M3. This reference current may be mirrored in FETs M5 and M6, FETs M7 and N4, and FETs M8 and N3. A bitline BL may be precharged to voltage VRD responsive to an increased voltage of signal PC applied to gates of FETs M9 and M10.

According to an embodiment, a current from a bitcell (e.g., on a bitline coupled to the bitcell) is compared with a reference current to determine an impedance state of a non-volatile memory element. In an implementation, current from the bitcell may be combined with the reference current at a node. An impedance state of the non-volatile memory element may be detected based, at least in part, on whether a net charge at the node is positive or negative. For example, a current from the bitcell may "source" charge to the node while the reference current may "sink" charge from the node. In this context, a device may "source" charge to a node by supplying a positive current to the node. Correspondingly, a device may "sink" charge to a node by supplying a negative current to the node. In an alternative example, a current from the bitcell may "sink" charge from the node while the reference current may "source" charge to the node.

As the voltage of signal PC is lowered following a precharge phase, bitline BL coupled to a memory device (e.g., CES device 352) may sink some amount of charge if the memory element is in a high impedance or insulative state. However, PFET M7 may source this amount of charge sinked if the memory element is in the high impedance or insulative state such that the current on bitline BL is greater than the sourced reference current (mirrored in FETs M7 and N4). This may provide a positive net current at a gate terminal of inverter 402 and positive voltage to the gate of inverter 402 to generate a "0" signal value for $V_{out}$. If the memory element is in a low impedance or conductive state while the voltage of signal PC is lowered following a precharge phase, the bitcell may sink more current than the reference current that is sourced by PFET M7. This may provide a negative net current at the gate terminal of inverter 402 and negative voltage to the gate of inverter 402 to generate a "1" signal value for $V_{out}$.

According to an embodiment, FETs N3 and N4 form a latch circuit having a state that is affected or determined by whether a magnitude of current on bitline BL is greater than or less than a magnitude of the reference current. Here, if the magnitude of the current from bitline BL in a read operation is lower than the magnitude of the reference current, FET M8 may be turned on or closed and FET N4 may turned off or opened, providing a high signal to an input terminal of inverter 402 and a low signal for $V_{out}$. If a magnitude of the current from bitline BL in a read operation is higher than a magnitude of the reference current (e.g., if memory element is in a conductive or low impedance state), FET M8 may be turned off or opened and FET N4 may be turned on or closed, providing a low signal to the input terminal of inverter 402 and a high signal for $V_{out}$.

Figure 5:
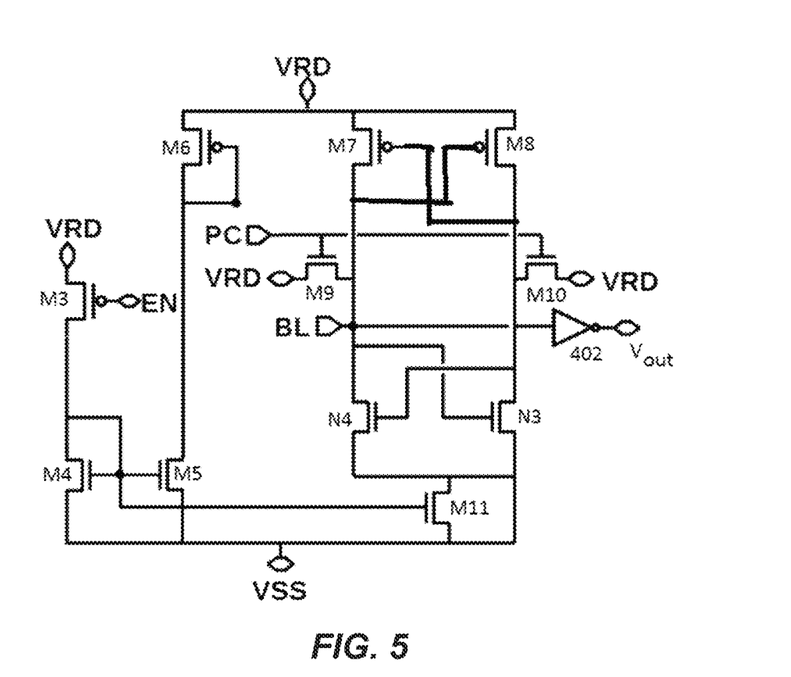
Figure 6:
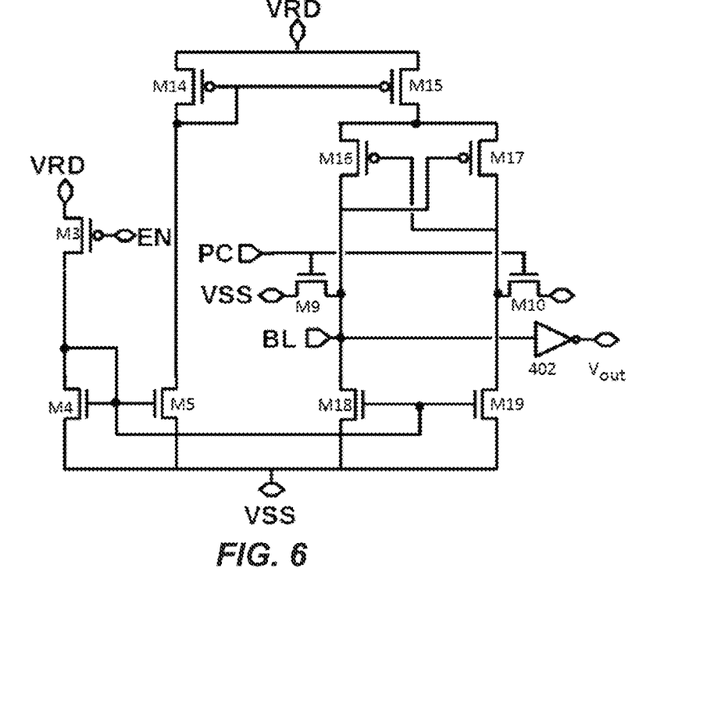
Figure 7:
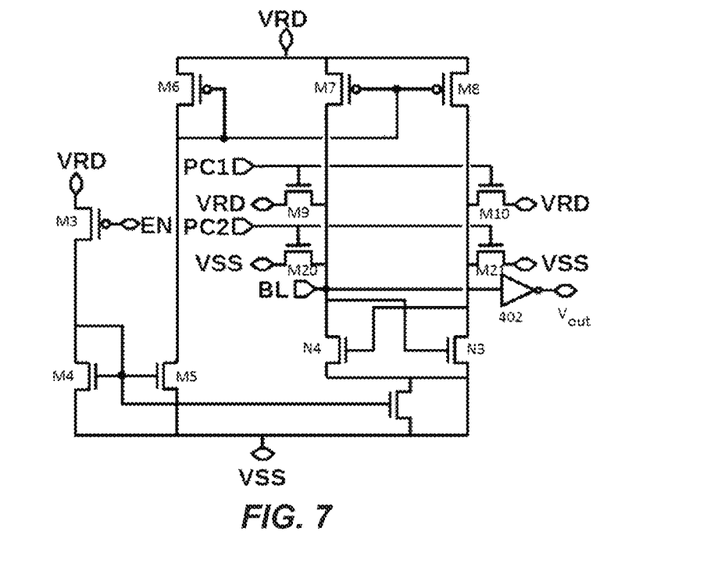

In the particular implementation of FIG. 5, gate terminals of FETs M7 and M8 are cross-connected as shown. This may allow a sense amplifier to extend or maintain an output voltage $V_{out}$ for a longer or indefinite period. In the particular implementation of FIG. 6, a latch formed by NFETs N3 and N4 in the embodiment of FIG. 4 is replaced by a latch formed by PFETs M16 and M17. If a magnitude of the current from bitline BL in a read operation is lower than a magnitude of the reference current (mirrored by FETs M16 and M18), FET M16 may be turned on or closed, providing a high signal to an input terminal of inverter 402 and a low signal for $V_{out}$. If a magnitude of the current from bitline BL in a read operation is higher than a magnitude of the reference current, FET M16 may be turned off or opened, providing a low signal to the input terminal of inverter 402 and a high signal for $V_{out}$.

According to an embodiment, to detect a current impedance state of a CES element in a read operation, a polarity of a read voltage $V_{read}$ applied across terminals of a CES element may be reversed. This may consequently reverse polarity of a current on a bitline to be sensed in such read operation. In the particular implementation of FIG. 7, bitline BL may be precharged in a reverse polarity at common source voltage VSS in response to a second precharge signal PC2 in read operations applying a reverse polarity read voltage $V_{read}$ across terminals of the CES element.

Figure 8:
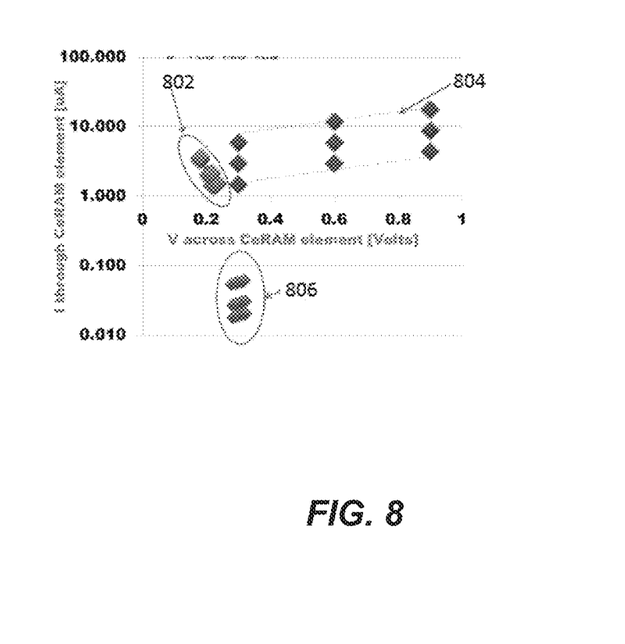
FIGS. 8 and 9 are plots illustrating read and write operations performed on CES devices according to particular embodiments.
Figure 9:
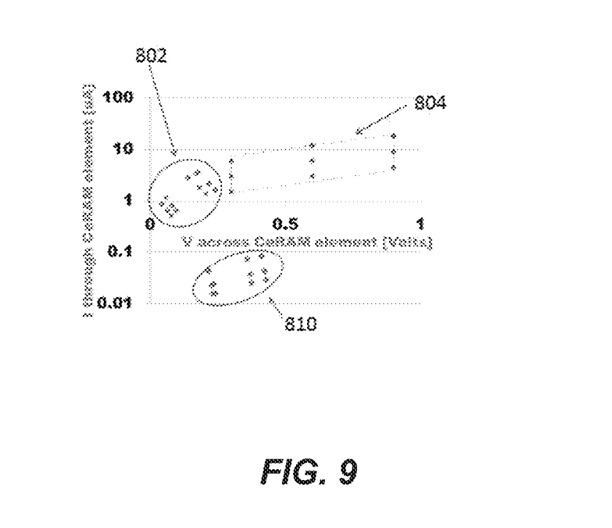

FIGS. 8 and 9 are plots of voltage and current of signals that may be applied to terminals of a CES element in a read operation according to an embodiment. Here, signals in region 804 may initiate an unintentional reset operation to place the CES element in a high impedance or insulative state. Accordingly, in a read operation it may be desirable to apply a read signal $V_{read}$ that has a sufficiently high voltage to allow for a sufficiently high current on a bitline to detect a current impedance state of the CES element in the presence of noise. However, it may also be desirable in a read operation on a CES element to avoid a current and voltage in the CES element in region 804 such that an unintentional reset operation does not occur, placing the CES element in a high impedance or insulative state.

Current throttling (e.g., enabled by use of FET M2) may allow for application of a higher voltage $V_{read}$ VRD while maintaining a lower current (e.g., below 0.100 µA) as illustrated by region 806 in FIG. 8 and region 810 in FIG. 9. In a particular embodiment, region 806 of FIG. 8 may be indicative of operation if a bitcell is sinking current in a read operation. Region 810 of FIG. 9 may be indicative of operation if a bitcell is sourcing current in a read operation.

In a further embodiment, one or more of a plurality of CEM devices (e.g., CES devices) may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment. In a further embodiment, CEM devices may be formed in devices in combination with conducting elements as described herein formed by the same or different processes. In an example implementation, CEM devices may be formed in combination with conducting elements using a different and/or complementary process technologies such as complementary metal oxide semiconductor (CMOS) technologies.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A device comprising:
a circuit to generate a reference current; and
a circuit to compare a signal current from a bitline coupled to a non-volatile memory element to the reference current to detect an impedance state of the non-volatile memory element, wherein the circuit to compare the signal current from the bitline to the reference current further comprises one or more conducting elements to selectively couple the bitline to a source voltage in response to the signal current exceeding the reference current and selectively disconnect the bitline from the source voltage in response to the signal current not exceeding the reference current.

2. The device of claim 1, wherein the non-volatile memory element comprises a correlated electron switch (CES) element.

3. The device of claim 2, and further comprising a circuit to generate a voltage to be applied to terminals of the CES element in a read operation.

4. The device of claim 1, and wherein the circuit to generate the reference current further comprises a circuit to source charge to the bitline in a pre-charge phase.

5. The device of claim 1, and wherein the circuit to generate the reference current further comprises a circuit to sink charge from the bitline in a pre-charge phase.

6. The device of claim 1, and wherein the circuit to generate the reference current further comprises:
 a circuit to source charge to the bitline in a pre-charge phase for a first read operation; and
 a circuit to sink charge from the bitline in a pre-charge phase for a second read operation.

7. The device of claim 6, wherein a current in the non-volatile memory element in the first read operation comprises a first polarity and a current in the non-volatile memory element in the second read operation comprises a second polarity opposite the first polarity.

8. The device of claim 1, and wherein the device further comprises:
 first and second cross-coupled transistors having a state responsive to a difference between the reference current and a current on the bitline; and
 an output circuit to provide an output signal responsive to the state of the first and second cross-coupled transistors.

9. The device of claim 1, and further comprising one or more conductive elements to limit the signal current during read operations.

10. A device comprising:
 a circuit to generate a reference current; and
 a circuit to compare a signal current from a bitline coupled to a non-volatile memory element to the reference current to detect an impedance state of the non-volatile memory element, wherein the circuit to compare the signal current from the bitline to the reference current further comprises one or more conducting elements to selectively couple the bitline to a voltage supply in response to the signal current not exceeding the reference current and selectively disconnect the bitline from the voltage supply in response to the signal current exceeding the reference current.

11. A method comprising:
generating a reference current; and
comparing a signal current from a bitline coupled to a non-volatile memory element to the reference current to detect an impedance state of the non-volatile memory element comprising:
 selectively coupling the bitline to a voltage supply if the signal current does not exceed the reference current; and
 selectively disconnecting the bitline from the voltage supply if the signal current exceeds the reference current.

12. The method of claim 11, and further comprising sourcing charge to the bitline in a pre-charge phase of a read operation.

13. The method of claim 11, and further comprising sinking charge from the bitline in a pre-charge phase of a read operation.

14. The device of claim 11, and further comprising:
 sourcing charge to the bitline in a pre-charge phase for a first read operation; and
 sinking charge from the bitline in a pre-charge phase for a second read operation.

15. The method of claim 11, wherein the non-volatile memory element comprises a correlated electron switch (CES) element.

16. The method of claim 11, wherein the non-volatile memory element comprises a correlated electron random access memory (CeRAM) element.

17. The method of claim 11, and further comprising:
 limiting the signal current during read operations.

18. The method of claim 11, wherein comparing the signal current from the bitline to the reference current further comprises:
 combining the signal current from the bitline with the reference current at a node; and
 detecting a net positive or negative current at the node.

19. A method comprising
generating a reference current; and
comparing a signal current from a bitline coupled to a non-volatile memory element to the reference current to detect an impedance state of the non-volatile memory element comprising:
 selectively coupling the bitline to a source voltage if the signal current exceeds the reference current; and
 selectively disconnecting the bitline from the source voltage if the signal current does not exceed the reference current.

* * * * *